United States Patent
Lin et al.

(10) Patent No.: US 12,170,347 B2
(45) Date of Patent: Dec. 17, 2024

(54) ELECTRONIC DEVICE

(71) Applicant: Innolux Corporation, Miao-Li County (TW)

(72) Inventors: Chun-Hsien Lin, Miao-Li County (TW); Shuhei Hosaka, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 475 days.

(21) Appl. No.: 17/504,519

(22) Filed: Oct. 19, 2021

(65) Prior Publication Data
US 2022/0140218 A1    May 5, 2022

(30) Foreign Application Priority Data

Oct. 30, 2020  (CN) .......................... 202011192048.9
Sep. 30, 2021  (CN) .......................... 202111162837.2

(51) Int. Cl.
*H01L 33/62*     (2010.01)
*H01L 25/075*    (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ................. H01L 33/62; H01L 25/0753; H01L 2933/0066; H01L 33/0095; H10K 59/30; H10K 59/38; H10K 71/851; H10K 71/861; H10K 71/00
See application file for complete search history.

(56) References Cited

U.S. PATENT DOCUMENTS

| | | | | |
|---|---|---|---|---|
| 8,896,798 | B2 * | 11/2014 | Wang | ................ G02F 1/13458 349/150 |
| 2016/0351092 | A1 * | 12/2016 | Chen | .................... G09G 3/3233 |
| 2019/0027534 | A1 | 1/2019 | Rotzoll et al. | |
| 2020/0266175 | A1 * | 8/2020 | Lo | ....................... H01L 25/0753 |
| 2020/0051482 | A1 | 12/2020 | Cok et al. | |

FOREIGN PATENT DOCUMENTS

| | | |
|---|---|---|
| CN | 104678629 | 11/2017 |
| CN | 108257516 | 7/2018 |
| TW | 201928459 | 7/2019 |
| TW | 202032779 | 9/2020 |

OTHER PUBLICATIONS

"Office Action of Taiwan Counterpart Application", issued on Jun. 6, 2022, p. 1-p. 6.
"Office Action of Taiwan Counterpart Application", issued on Jan. 9, 2023, p. 1-p. 6.
"Search Report of Europe Counterpart Application", issued on Mar. 24, 2022, p. 1-p. 8.
"Office Action of Taiwan Counterpart Application", issued on Jul. 30, 2024, p. 1-p. 8.

* cited by examiner

*Primary Examiner* — Jarrett J Stark
(74) *Attorney, Agent, or Firm* — JCIPRNET

(57) ABSTRACT

An embodiment of the disclosure provides an electronic device including multiple units. Each unit in the units includes multiple primary bonding regions and at least one reserved bonding region. Each reserved bonding region is connected to the primary bonding regions. The number of the at least one reserved bonding region is less than the number of primary bonding regions.

18 Claims, 6 Drawing Sheets

ELECTRONIC DEVICE

CROSS-REFERENCE TO RELATED APPLICATION

This application claims the priority benefit of China application serial no. 202011192048.9, filed on Oct. 30, 2020, and China divisional application serial no. 202111162837.2, filed on Sep. 30, 2021. The entirety of the above-mentioned patent applications is hereby incorporated by reference herein and made a part of this specification.

BACKGROUND

Technical Field

This disclosure relates to an electronic device.

Description of Related Art

Electronic devices have been widely used in electronic appliances such as mobile phones, TVs, monitors, tablet computers, car displays, wearable devices, and desktop computers. With the vigorous development of electronic products, the requirements for display quality of the electronic products are increasingly higher, and thus electronic devices continue to be improved towards becoming lighter, thinner, shorter, smaller, and frameless, and having a display that is larger or with a higher resolution. Regarding electronic devices with high transmittance or high resolution, since the size of the electronic devices continues to shrink, a problem of insufficient wiring space or insufficient space reserved for repair occurs.

SUMMARY

According to an embodiment of the disclosure, an electronic device includes multiple units. Each of the units includes multiple primary bonding regions and at least one reserved bonding region. Each of the at least one reserved bonding region is connected to multiple primary bonding regions, and the number of the at least one reserved bonding region is less than the number of primary bonding regions.

DESCRIPTION OF THE EMBODIMENTS

Figure 1:
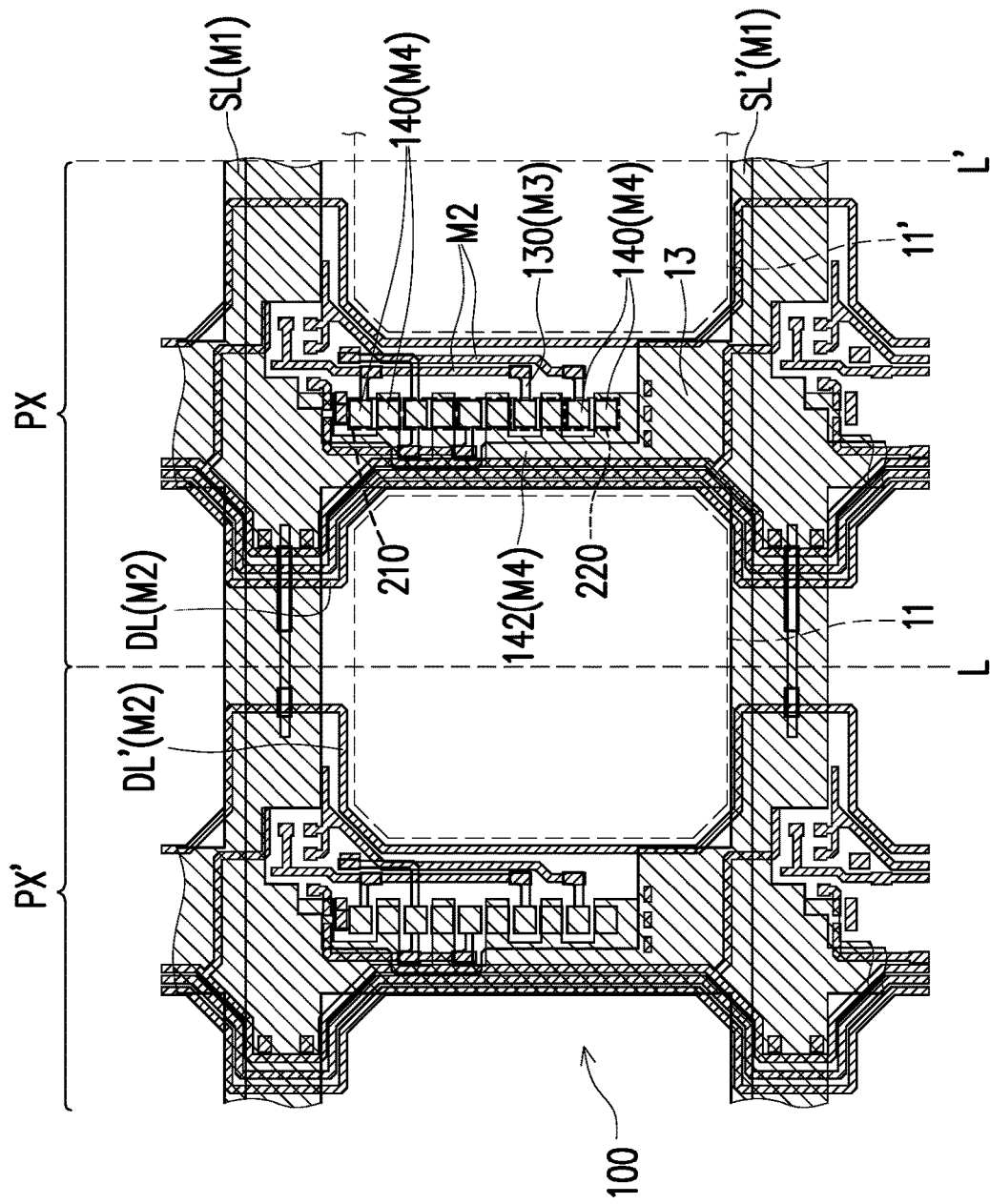
FIG. 1 is a top schematic view of units of an electronic device according to an embodiment of the disclosure.

This disclosure may be understood by referring to the following detailed description in conjunction with the accompanying drawings. It should be noted that, in order for clarity and simplicity of the drawings, the multiple drawings in this disclosure only depict a part of an electronic device. The specific elements in the drawings are not drawn according to actual scale. In addition, the number and size of each element in the drawings are for illustration only, and are not used to limit the scope of this disclosure.

Certain words are used throughout the specification of the disclosure and the appended claims to refer to specific elements. Those skilled in the art should understand that electronic appliance manufacturers may refer to the same element by different names. This specification does not intend to distinguish elements with a same function but different names. In the following specification and claims, words such as "including", "containing", and "having" are open-ended words, so they should be interpreted as meaning "containing but not limited to . . . ". Therefore, when the terms "including", "containing" and/or "having" are used in the description of this disclosure, they specify the existence of a corresponding feature, region, step, operation, and/or component, but do not exclude the existence of one or more corresponding features, regions, steps, operations, and/or components.

Direction terms mentioned in this specification, such as "upper", "lower", "front", "rear", "left", "right", etc., are only directions with reference to the drawings. Therefore, the direction terms used is for illustration, not for limiting this disclosure. In the drawings, each drawing shows the general features of the method, structure, and/or material used in a specific embodiment. However, these drawings should not be construed as defining or limiting the scope or nature of the embodiments. For example, for the sake of clarity, the relative size, thickness, and position of each layer, region, and/or structure may be reduced or enlarged.

It should be understood that when a component or film layer is said to be "connected" to another component or film layer, it may be directly connected to said other component or film layer, or there may an intervening component or film layer between the two. When a component is said to be "directly connected" to another component or film, there is no intervening component or film between the two. The terms "approximately", "equal to", "equal" or "same", "substantially" or "roughly" are generally interpreted as being within 20% of a given value or range, or interpreted as being within 10%, 5%, 3%, 2%, 1% or 0.5% of a given value or range.

A structure (or layer type, component, substrate) being located on another structure (or layer type, element, substrate) described in this disclosure may refer to two structures being adjacent and directly connected to each other, or may refer to two structures being adjacent but not directly connected to each other. An indirect connection means that there is at least one intermediary structure (or intermediary layer, intermediary component, intermediary substrate, or intermediary interval) between two structures, and the lower lateral surface of a structure is adjacent or directly connected to the upper lateral surface of an intermediary structure, and the upper lateral surface of another structure is adjacent or directly connected to the lower lateral surface of the intermediary structure, and the intermediary structure may be a monolayer or multi-layer physical structure or a non-physical structure, and the disclosure is not limited thereto. In this disclosure, when a structure is "above" another structure, it may mean that a certain structure is "directly" on another structure, or that a certain structure is "indirectly" on another structure, that is, there is at least one structure between said certain structure and said another structure.

"First", "second" . . . etc. in the specification of this disclosure may be used herein to describe various elements, components, regions, layers and/or parts, but these elements, components, regions, and/or parts should be limited by these terms. These terms are only used to distinguish one element, component, region, layer or section from another element, component, region, layer or section. Therefore, a "first element", "component", "region", "layer", or "part" described below are used to distinguish from a "second element", "component", "region", "layer", or "part", but are not used to limit the order or limit to a specific element, component, region, layer and/or part.

An electronic device disclosed in the disclosure may include a display device, a backlight device, an antenna device, a sensing device, or a splicing device, but is not limited thereto. The electronic device may be a bendable or flexible electronic device. The display device may be a non-self-luminous type display device or a self-luminous type display device. The antenna device may be a liquid crystal type antenna device or a non-liquid crystal type antenna device. The sensing device may be a sensing device that senses capacitance, light, heat, or ultrasound, but is not limited thereto. An electronic element may include a passive element and an active element, such as a capacitor, a resistor, an inductor, a diode, and a transistor. The diode may include a light emitting diode or a photodiode. The light emitting diode may include, for example, an organic light emitting diode (OLED), a mini light emitting diode (mini LED), a micro light emitting diode (micro LED), or a quantum dot light emitting diode (quantum dot LED), but is not limited thereto. The splicing device may be, for example, a display splicing device or an antenna splicing device, but is not limited thereto. It should be noted that the electronic device may be any combination of the foregoing, but is not limited thereto. Hereinafter, the display device as the electronic device or the splicing device will be used to illustrate the content of the disclosure, but the disclosure is not limited thereto. In this disclosure, the various embodiments described below may be combined without departing from the spirit and scope of this disclosure. For example, some features of one embodiment may be combined with some features of another embodiment to form another embodiment.

Reference will now be made in detail to the exemplary embodiment disclosed in the disclosure, and examples of the exemplary embodiment are illustrated in the accompanying drawings. Whenever possible, same element symbols are used in the drawings and descriptions to indicate same or similar parts.

FIG. 1 is a top schematic view of units of an electronic device according to an embodiment of the disclosure. For the clarity of the drawings and the convenience of description, several elements are omitted in FIG. 1. Referring to FIG. 1, an electronic device 10 includes a plurality of units PX. Each unit PX includes a plurality of primary bonding regions 210 and at least one reserved bonding region 220. In some embodiments, the electronic device 10 further includes an opening region 11 and a non-opening region 13 surrounding the opening region 11. The primary bonding region 210 and the reserved bonding region 220 correspondingly overlap the non-opening region 13. The primary bonding region 210 is used to be bonded with an electronic element, and the reserved bonding region 220 includes an electronic element reserved space 320, which is used for being bonded with an electronic element. In this embodiment, the reserved bonding region 220 is connected to the primary bonding region 210, and the number of reserved bonding region 220 is less than the number of primary bonding region 210. Under the above disposition, the unit PX may reserve space for wiring layout to realize a repair design, or be applied as a unit with a transmissive display function.

Referring to FIG. 1, the electronic device 10 includes a substrate 100. The plurality of units PX are disposed on the substrate 100. The substrate 100 may be a rigid substrate or a flexible substrate. The material of the substrate 100 includes, for example, glass, quartz, ceramic, sapphire, or plastic, etc., but the disclosure is not limited thereto. In some embodiments, when the substrate 100 is a flexible substrate, a suitable flexible material may be included, such as polycarbonate (PC), polyimide (PI), polypropylene (PP) or polyethylene terephthalate (PET), other suitable materials, or a combination of the aforementioned materials, but the disclosure is not limited thereto. In addition, the light transmittance of the substrate 100 is not limited, that is, the substrate 100 may be a transparent substrate, a semi-transmissive substrate, or an opaque substrate. In this embodiment, the electronic device 10 may be an electronic device applied as a transmissive display technology with a high transmission rate, but the disclosure is not limited thereto.

In some embodiments, in the top view direction (also known as the Z axis), the plurality of units PX of the electronic device 10 may be arranged on the X axis and the Y axis into a plurality of rows and a plurality of columns, so that the plurality of units PX are arranged in an array. In this embodiment, the X axis and the Y axis are substantially perpendicular to each other, and the X axis and the Y axis are substantially perpendicular to the Z axis. In some embodiments, the electronic device 10 further includes a plurality of signal wires and a plurality of thin film transistors (not shown) disposed on the substrate 100. The plurality of units PX may be electrically connected to the plurality of signal wires and the plurality of thin film transistors. For example, the plurality of signal wires include scanning wires, data wires, or other conductive wires. The signal wires may be partially electrically connected to the thin film transistors (TFT). In this embodiment, the thin film transistors may be electrically connected to a scanning wire SL or a data wire DL. The thin film transistors include, for example, a semiconductor channel layer, a gate (electrically connected to the scanning wire), and a source and a drain electrically connected to the semiconductor channel layer. The material of the semiconductor channel layer includes, for example, amorphous silicon, low temperature poly-silicon (LTPS), or a metal oxide, or a combination of the aforementioned materials, and the disclosure is not limited thereto. In some embodiments, different thin film transistors may have the above-mentioned different semiconductor materials. In addition, the thin film transistors may include a top gate transistor, a bottom gate transistor, a dual gate transistor, and a double gate transistor, but the disclosure is not limited thereto.

In this embodiment, the gate may be electrically connected to the scanning wire, and the source may be electrically connected to the data wire. The material of the gate may include molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), argentum (Ag), other suitable metals, or a combination or an alloy of the above material, but the disclosure is not limited thereto. The material of the source and the drain may include a transparent conductive material or a non-transparent conductive material, such as indium tin oxide, indium zinc oxide, indium oxide, zinc oxide, tin oxide, a metal material (such as aluminum, molybdenum, copper, argentum, etc.), other suitable materials or a combination of the above, but the disclosure is not limited thereto.

In this embodiment, the electronic device 10 may include a multi-layer insulation layer (not shown) and a multi-layer circuit layer disposed on the insulation layer or between the multi-layer insulation layer. The insulation layer may be a monolayer or a multilayer structure, and may include, for example, an organic material, an inorganic material, or a combination of the above, but the disclosure is not limited thereto. The organic material may include polyethylene terephthalate (PET), polyethylene (PE), polyethersulfone (PES), polycarbonate (PC), polymethylmethacrylate (PMMA), polyimide (PI), photo sensitive polyimide (PSPI) or a combination of the above, and the inorganic material may include silicon nitride, silicon oxide, nitrogen silicon oxide, or a combination of the above, but the disclosure is not limited thereto.

In this embodiment, a multi-layer circuit layer ML may be applied as the aforementioned signal wire, including a scanning wire, a data wire or other conductive wires. The material of the multi-layer circuit layer ML may include a transparent conductive material or a non-transparent conductive material, such as indium tin oxide, indium zinc oxide, indium oxide, zinc oxide, tin oxide, a metal material (such as aluminum, molybdenum, copper, and argentum), other suitable materials or a combination of the above, but the disclosure is not limited thereto. As shown in FIG. 1, the multi-layer circuit layer ML may include a first circuit layer M1. The first circuit layer M1 may, for example, include a plurality of scanning wires SL and SL', and the plurality of scanning wires SL and SL' partially extend roughly along the X axis, but the disclosure is not limited thereto.

In this embodiment, the multi-layer circuit layer ML may further include a second circuit layer M2. On the Z axis, the second circuit layer M2 is disposed above the first circuit layer M1, and the second circuit layer M2 partially overlaps the first circuit layer M1. The second circuit layer M2 may, for example, include a plurality of data wires DL and DL', and the plurality of data wires DL and DL' partially extend roughly along the Y axis, but the disclosure is not limited thereto. From another perspective, the first circuit layer M1 and the second circuit layer M2 may be disposed in an interleaved manner.

The multi-layer circuit layer ML may further include a third circuit layer M3 and a fourth circuit layer M4. On the Z axis, the third circuit layer M3 is disposed above the second circuit layer M2, and the fourth circuit layer M4 is disposed above the third circuit layer M3. The third circuit layer M3 partially overlaps the second circuit layer M2, and the fourth circuit layer M4 partially overlaps the third circuit layer M3. The third circuit layer M3 includes, for example, a circuit line or a bridge circuit 130, and a part thereof extends roughly along the X axis, and another part thereof extends roughly along the Y axis. The fourth circuit layer M4 includes, for example, a bonding pad 140 or a shared circuit wire 142, and a part thereof extends roughly along the X axis, and another part thereof extends roughly along the Y axis, but the disclosure is not limited thereto. In this embodiment, a part of the third circuit layer M3 may be electrically connected to a part of the second circuit layer M2 through a via (not shown) on the insulation layer, and a part of the fourth circuit layer M4 may be electrically connected to a part of the third circuit layer M3 through another via (not shown) on the insulation layer. Under the above disposition, the fourth circuit layer M4 includes a plurality of bonding pads 140, the bonding pads 140 may partially be connected to the shared circuit wire 142 (which may be located in the fourth circuit layer M4), and another part of the bonding pads 140 may be electrically connected to the data wire DL of the second circuit layer M2 through the bridge circuit 130, but the disclosure is not limited thereto.

In this embodiment, the opening region 11 is defined by a region that may be roughly surrounded by two adjacent data wire DL and data wire DL' of two adjacent unit PX and unit PX', respectively (as shown in FIG. 1). For example, the opening region 11 may be a region through which ambient light penetrates. In other embodiments, the opening region 11 may be defined by a region that may be surrounded by two adjacent data wires DL and DL' and two adjacent scanning wires SL and SL'. That is, the opening region 11 does not roughly overlap the circuit layer ML (including the first circuit layer M1, the second circuit layer M2, the third circuit layer M3, or the fourth circuit layer M4). In some embodiments, the opening region 11 is, for example, an octagonal shape, but the disclosure is not limited thereto. In other embodiments, the opening region 11 may also be triangular, rectangular, polygonal, star-shaped, circular, or irregular, and the disclosure is the disclosure is not limited thereto.

In this embodiment, the opening region 11 may be surrounded by the non-opening region 13. At least a part of the circuit layer ML (including the first circuit layer M1, the second circuit layer M2, the third circuit layer M3, or the fourth circuit layer M4) may overlap the non-opening region 13. That is, at least the scanning wire SL, the data wire DL, the bridge circuit 130, the bonding pad 140, or the shared circuit wire 142 may partially overlap the non-opening region 13, but the disclosure is not limited thereto.

In some embodiments, the primary bonding region 210 and the reserved bonding region 220 of the unit PX may be disposed corresponding to the non-opening region 13. In other words, the primary bonding region 210 and the at least one reserved bonding region 220 correspondingly overlap the non-opening region 13. For example, a plurality of primary bonding regions 210 may overlap the second circuit layer M2, the third circuit layer M3, or the fourth circuit layer M4. The reserved bonding region 220 may overlap the second circuit layer M2, the third circuit layer M3, or the fourth circuit layer M4. Each primary bonding region 210 includes two bonding pads 140. Each reserved bonding region 220 includes two bonding pads 140. In this embodiment, the bonding pad 140 may be applied as an electrode for connecting to an electronic element. The electronic element may include, for example, a blue light emitting diode 300B, a green light emitting diode 300G, or a red light emitting diode 300R, but is not limited thereto. In other words, each primary bonding region 210 may be bonded with the blue light emitting diode 300B, the green light emitting diode 300G, or the red light emitting diode 300R, and in the top view direction, at least a part of the primary bonding region 210 overlaps the electronic element (for example, the blue light emitting diode 300B, the green light emitting diode 300G, or the red light emitting diode 300R). Each reserved bonding region 220 may be bonded with the blue light emitting diode 300B, the green light emitting diode 300G, or the red light emitting diode 300R, but the disclosure is not limited thereto. In this embodiment, the number of reserved bonding regions 220 is less than the number of primary bonding regions 210. For example, FIG. 1 shows that three primary bonding regions 210 may be arranged in sequence along the Y axis and overlap the non-opening region 13, and two reserved bonding regions 220 may be arranged along the Y axis following the primary bonding regions 210 and overlap the non-opening region 13, but the disclosure is not limited thereto. That is to say, the primary bonding region 210 is disposed to be connected to or adjacent to the backup bonding region 220. In other embodiments, the reserved bonding regions 220 may be arranged to be interleaved with the primary bonding regions 210, or the reserved bonding regions 220 may be arranged on opposite ends of the primary bonding regions 210, but the disclosure is not limited thereto. In addition, it should be noted that the number of primary bonding regions 210 and the number of reserved bonding regions 220 shown in FIG. 1 are for illustrative purposes only, and are not used to specifically limit the disclosure. In other embodiments, the number of primary bonding regions 210 may be two, four or more, and the number of reserved bonding regions 220 may be one, three or more, and the disclosure is not limited thereto.

In this embodiment, the definition of the unit PX is, for example, a region between central lines L and L' of opening regions 11 and 11' which are on opposite sides of the primary bonding region 210 and the reserved bonding region 220 on the X axis in the non-opening region 13. For example, the opening region 11 on the left side of the primary bonding region 210 and the reserved bonding region 220 is separated by the central line L to generate two halves of equal area. The opening region 11' on the right side of the primary bonding region 210 and the reserved bonding region 220 is separated by the central line L' to generate two halves of equal area. The region between the central line L of the opening region 11 and the central line L' of the opening region 11' may be referred to as the unit PX. In other words, the unit PX includes the primary bonding region 210 and the reserved bonding region 220 overlapping the non-opening region 13 and half of the two opening regions 11 and 11' on opposite sides thereof, but the disclosure is not limited thereto.

In this embodiment, the electronic device 10 may further include a light blocking layer BM (not shown in FIG. 1). At least a part of the light blocking layer BM correspondingly overlaps the non-opening region 13. For example, the light blocking layer BM may be disposed on the substrate 100 and disposed below the circuit layer ML on the Z axis. That is, at least a part of the first circuit layer M1, the second circuit layer M2, the third circuit layer M3, or the fourth circuit layer M4 is disposed above the light blocking layer BM and overlaps the light blocking layer BM. From another perspective, the light blocking layer BM does not overlap the opening region 11, but surrounds the opening region 11 corresponding to the non-opening region 13. Therefore, in some embodiments, when the multi-layer circuit layer cannot clearly present the data wire or/and the scanning wire, the region surrounded by the light blocking layer BM may be defined as the opening region 11. In addition, the primary bonding region 210 and the reserved bonding region 220 may correspondingly overlap the light blocking layer BM. In this embodiment, the light blocking layer BM is, for example, a black matrix, and a material thereof may include a metal or an opaque resin doped with a coloring material, or other suitable materials or a combination of the foregoing materials, but the disclosure is not limited thereto. The metal mentioned above may be chromium (Cr), but the disclosure is not limited thereto. The above resin may be, for example, an epoxy resin or an acrylic resin, or other suitable materials or a combination of the above materials, but the disclosure is not limited thereto. Under the above disposition, the contrast of the electronic device 10 may be increased.

It is worth noting that the circuit layer ML, the primary bonding region 210, and the reserved bonding region 220 of the electronic device 10 according to an embodiment of the disclosure may overlap the light blocking layer BM and be disposed in the non-opening region 13 outside the opening region 11, so the unit PX of the electronic device 10 may pass through the opening region 11 to have a high transmittance. In this way, the unit PX may be applied as a unit with a transmissive display function. In this way, the electronic device 10 has good visual effects or display quality. In addition, the primary bonding region 210 is bonded with the electronic element, and the reserved bonding region 220 includes the electronic element reserved space 320 for being bonded with a repair or backup electronic element. Therefore, the unit PX of the electronic device 10 may reserve space to have a design to realize unit repair. In this way, the electronic device 10 has good electrical quality.

Figure 2:
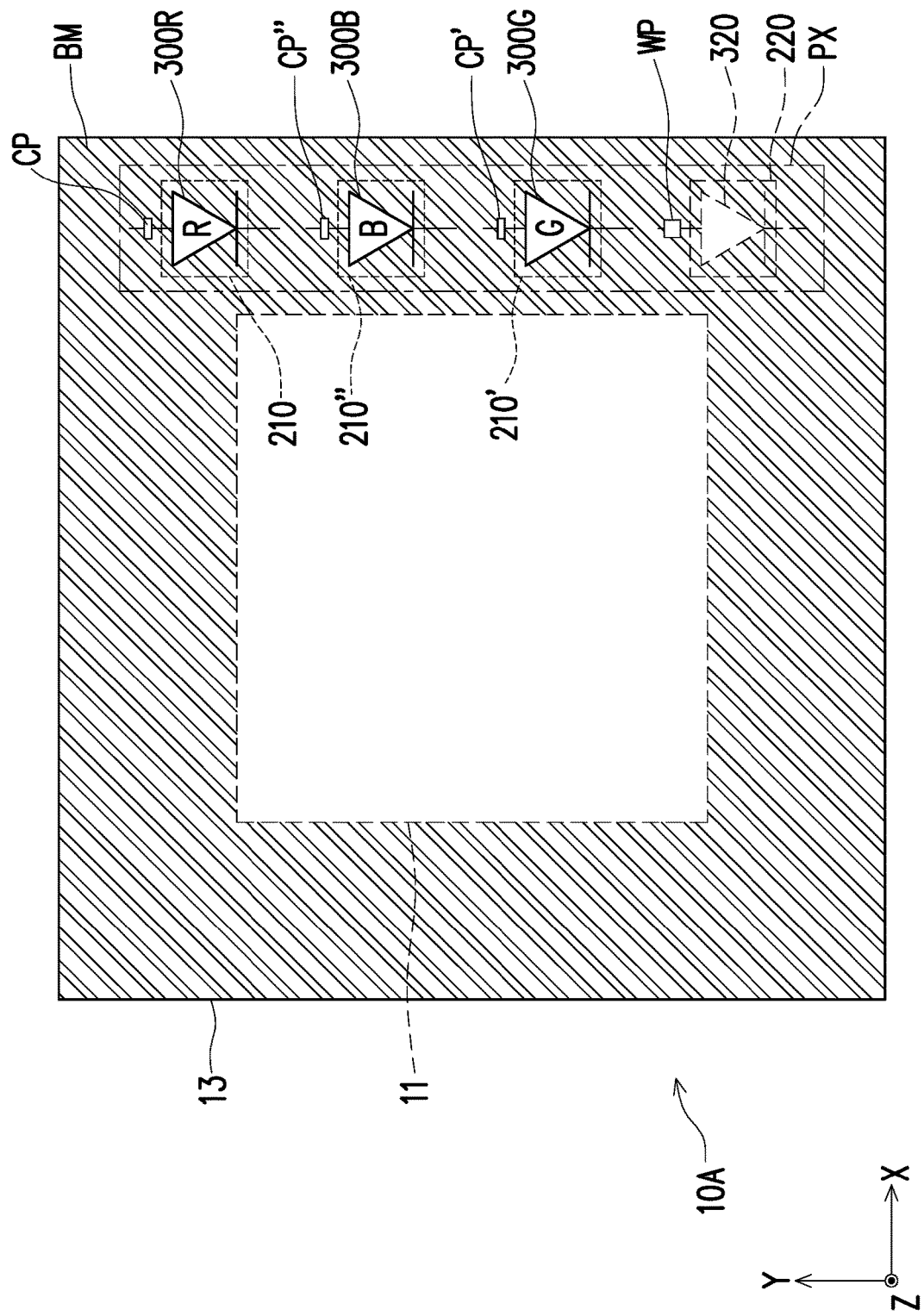
FIG. 2 is a top schematic view of a part of an electronic device according to another embodiment of the disclosure.
Figure 3:
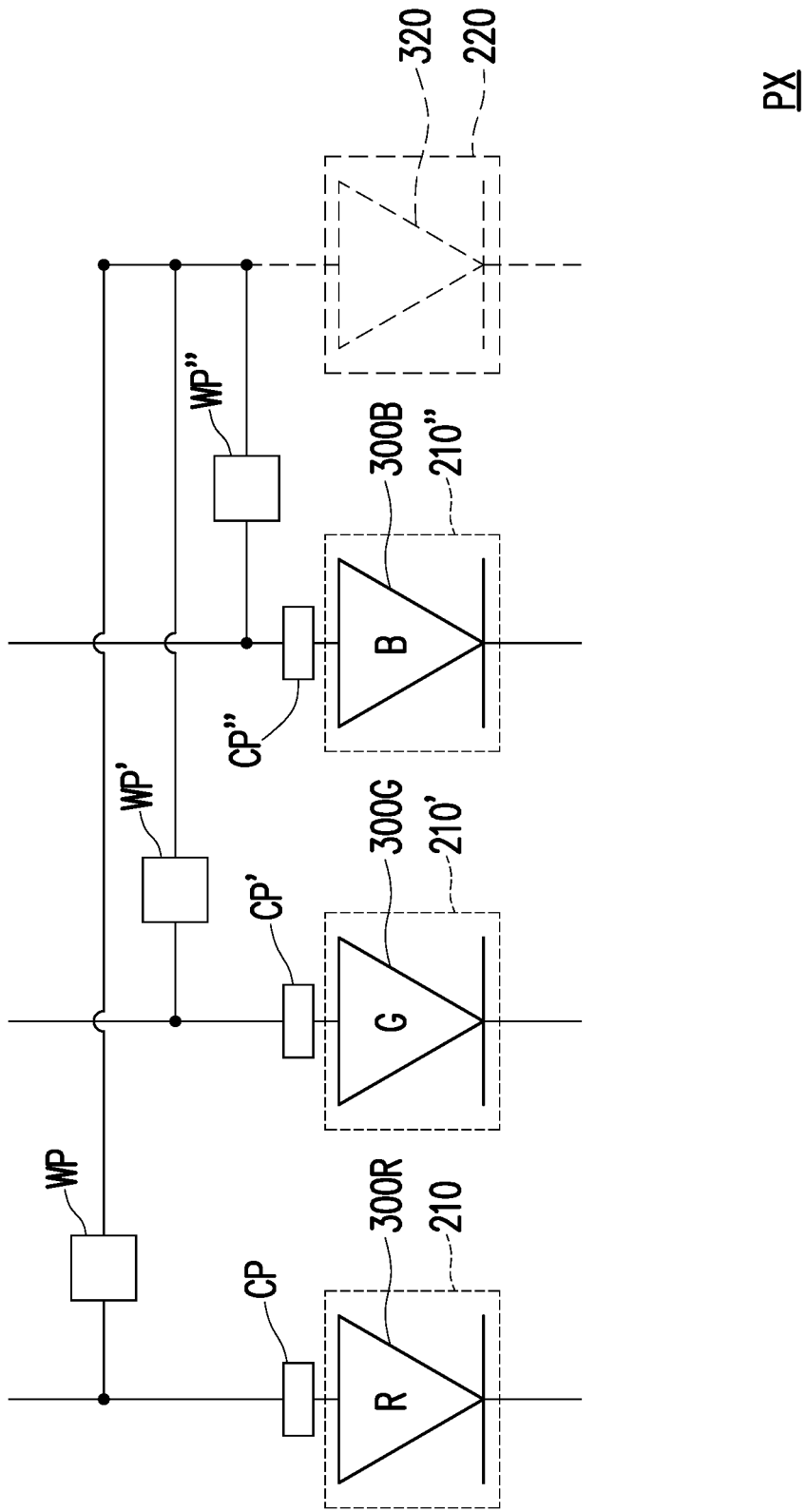
FIG. 3 is a schematic circuit view of a unit shown in FIG. 2.

The following will illustrate the steps and methods of unit repair with a simple schematic view and a simple circuit view shown in FIGS. 2 and 3.

FIG. 2 is a top schematic view of a part of an electronic device according to another embodiment of the disclosure. FIG. 3 is a schematic circuit view of a unit shown in FIG. 2. For the clarity of the drawings and the convenience of description, several elements are omitted in FIGS. 2 and 3. Referring to FIG. 2 first, an electronic device 10A includes the unit PX. In some embodiments, the electronic device 10A further includes the opening region 11 and the non-opening region 13 surrounding the opening region 11. The light blocking layer BM is disposed to correspondingly overlap the non-opening region 13 and surround the opening region 11. The unit PX includes a plurality of primary bonding regions 210, 210', and 210" and at least one reserved bonding region 220. The plurality of primary bonding regions 210, 210', and 210" are disposed to be arranged along the Y axis and overlap the non-opening region 13. At least one reserved bonding region 220 is disposed corresponding to one end of one of the primary bonding regions (such as the primary bonding region 210), and is disposed to overlap the non-opening region 13. The primary bonding region (such as the primary bonding region 210) and the reserved bonding region 220 are respectively used for being bonded with electronic elements.

For example, the light emitting diode 300R is correspondingly bonded with the primary bonding region 210, the light emitting diode 300B is correspondingly bonded with the primary bonding region 210', and the light emitting diode 300G is correspondingly bonded with the primary bonding region 210". That is, in the top view direction (Z-axis direction), at least the primary bonding regions 210, 210', and 210" respectively partially overlap the light emitting diodes 300R, 300G, and 300R. In addition, the reserved bonding region 220 is adjacent to the primary bonding region 210" where the light emitting diode 300G is disposed.

In this embodiment, the primary bonding region 210 is connected to the reserved bonding region 220. For example, referring to FIGS. 2 and 3, the light emitting diode 300R, the light emitting diode 300G, and the light emitting diode 300B are respectively connected to the reserved bonding region 220 via a conductive wire or a bridge circuit. The electronic device 10A has planned welding points WP, WP', and WP" (only one planned welding point WP is shown in FIG. 2) located between the reserved bonding region 220 and the primary bonding regions 210, 210', and 210" connected to the reserved bonding region 220. For example, the planned welding point WP is between the primary bonding region 210 and the light emitting diode 300R bonded with the primary bonding region 210, and the reserved bonding region 220. The planned welding point WP' is between the primary bonding region 210' and the light emitting diode 300G bonded with the primary bonding region 210', and the reserved bonding region 220. The planned welding point WP" is between the primary bonding region 210" and the light emitting diode 300B bonded with the primary bonding region 210", and the reserved bonding region 220. In addition, the electronic device 10A further includes planned cutting points CP, CP', and CP" located between the planned welding points WP, WP', WP" and the primary bonding regions 210, 210', 210". For example, the planned cutting point CP is between the primary bonding region 210 and the light emitting diode 300R bonded with the primary bonding region 210, and the planned welding point WP. The planned cutting point CP' is between the primary bonding region 210' and the light emitting diode 300G bonded with the primary bonding region 210', and the planned welding point WP'. The planned cutting point CP" is between the primary bonding region 210" and the light emitting diode 300B bonded with the primary bonding region 210", and the planned welding point WP". Taking the light emitting diode 300R as an example, under the above disposition, when the light emitting diode 300R does not meet the inspection specification (for example, including: dark dots, bright dots, or appearance damage), a repair process of the electronic device 10A may be performed. The above-mentioned repair process includes: the electronic element used for repair (such as a red electronic element) is bonded with the bonding pad of the electronic element reserved space 320 in the reserved bonding region 220; next, a laser cutting process is performed on the conductive wire or the bridge circuit on the planned cutting point CP; next, a laser welding process is performed on the planned welding point WP. After the above repair process is completed, a voltage is provided to the electronic device 10A; next, the light emitting diode 300R bonded in the primary bonding region 210 does not receive the voltage and does not emit light. The electronic element for repair bonded in the reserved bonding region 220 may receive the above voltage to emit light. In this way, the electronic device 10A may complete the repair of the electronic element through the repair process, so the electronic device 10A may have good electrical quality.

It should be noted that the number of reserved bonding regions 220 in the unit PX of the electronic device 10A according to an embodiment is less than the number of primary bonding regions 210, 210', and 210". For example, the number of primary bonding regions 210 shown in FIGS. 2 and 3 is three, which are respectively for the blue light emitting diode 300B, the green light emitting diode 300G, and the red light emitting diode 300R. The number of reserved bonding region 220 is one, which means that the reserved bonding region 220 may be correspondingly bonded with one electronic element for repair (for example: a blue light emitting diode, a green light emitting diode, or a red light emitting diode disposed in the electronic element reserved space 320). However, the above quantitative relationship is not used to limit the disclosure. Under the above disposition, in the process of repairing the electronic device 10A, the electronic element for repair may be selectively disposed in the reserved space. In this way, costs may be reduced. In addition, since the reserved space may be reduced, the space for circuit disposition may be increased to meet the requirements of a high circuit density design or the transmission rate of the opening region 11 may be increased. In this way, the electronic device 10A may have good electrical quality.

Other embodiments will be listed below for illustration. It must be noted here that the following embodiments use the element labels and part of the content of the aforementioned embodiment, and same labels are used to represent same or similar elements, and the description of the same technical content is omitted. The aforementioned embodiment may be referred to for the description of the omitted parts, which will not be repeated in the following embodiment.

Figure 4:
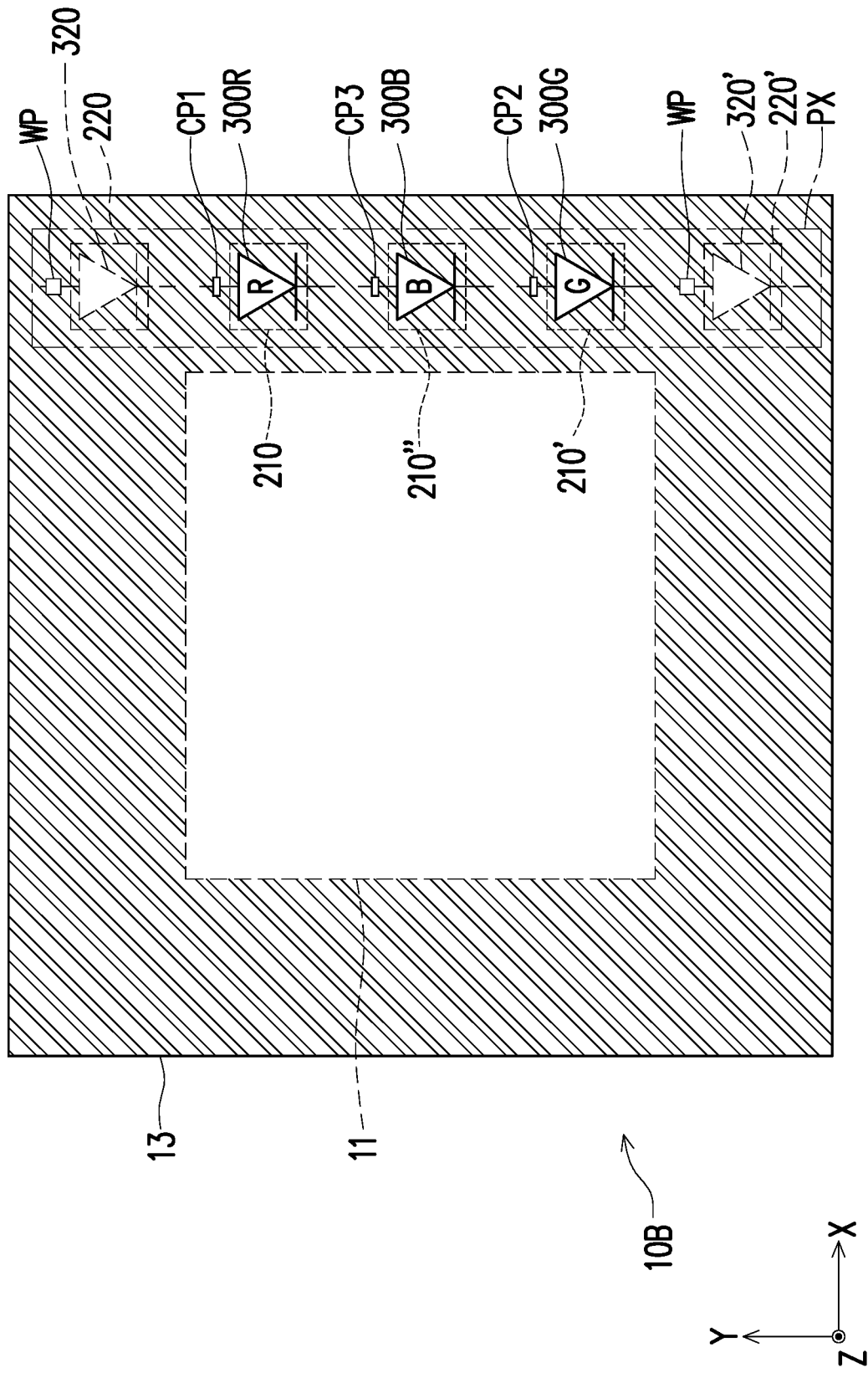
FIG. 4 is a top schematic view of a part of an electronic device according to another embodiment of the disclosure.
Figure 5:
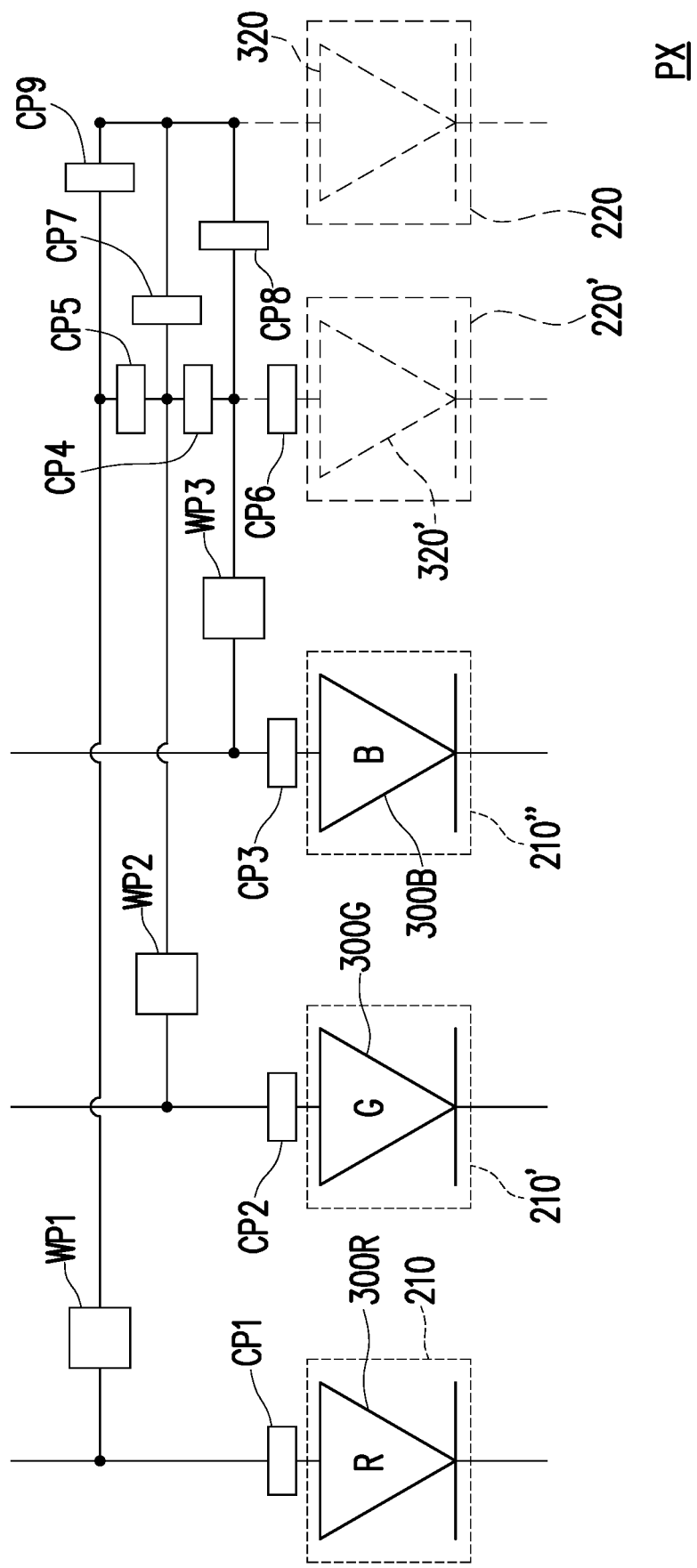
FIG. 5 is a schematic circuit view of a unit shown in FIG. 4.

FIG. 4 is a top schematic view of a part of an electronic device according to another embodiment of the disclosure. FIG. 5 is a schematic circuit view of a unit shown in FIG. 4. For the clarity of the drawings and the convenience of description, several elements are omitted in FIGS. 4 and 5. An electronic device 10B of this embodiment is roughly similar to the electronic device 10A of FIGS. 2 and 3, so the same and similar components in the two embodiments will not be repeated herein. This embodiment is different from the electronic device 10A mainly in that the electronic device 10B includes the unit PX, the opening region 11, and the non-opening region 13 surrounding the opening region 11. The unit PX includes three primary bonding regions 210, 210', and 210", and two reserved bonding regions 220 and 220'. For example, the reserved bonding region 220 may be disposed adjacent to the primary bonding region 210, and the reserved bonding region 220' may be disposed adjacent to the bonding region 210'. The planned welding point WP is disposed corresponding to the reserved bonding region 220. The planned welding point WP is disposed corresponding to the reserved bonding region 220'. The electronic element reserved space 320 in the reserved bonding region 220 may be bonded with the electronic element for repair. An electronic element reserved space 320' in a reserved bonding region 220' may be bonded with another electronic element for repair, but the above quantitative relationship is not used to limit this disclosure. In this embodiment, the number of reserved bonding regions 220 and 220' is less than the number of primary bonding regions 210, 210', and 210". Since the reserved space may be reduced, the space for circuit disposition may be increased to meet the requirements of a high circuit density design or the transmission rate of the opening region 11 may be increased. In this way, the electronic device 10B may be repaired, and may have good electrical quality.

The following is a brief description of the steps and methods of unit repair with a circuit view shown in FIG. 5.

Referring to FIG. 5, the light emitting diode 300R, the light emitting diode 300G, and the light emitting diode 300B are respectively connected to the reserved bonding regions 220 and 220' through a conductive wire or a bridge circuit. The unit PX of the electronic device 10B has planned welding points WP1, WP2, and WP3 located between the reserved bonding region 220 or the reserved bonding region 220' and the primary bonding regions 210, 210', and 210". For example, the planned welding point WP1 is between the primary bonding region 210 and the light emitting diode 300R bonded thereto and the reserved bonding region 220 or the reserved bonding region 220'. The planned welding point WP2 is between the primary bonding region 210' and the light emitting diode 300G bonded thereto and the reserved bonding region 220 or the reserved bonding region 220'. The planned welding point WP3 is between the primary bonding region 210" and the light emitting diode 300B bonded thereto and the reserved bonding region 220 or the reserved bonding region 220'. In addition, the electronic device 10B further includes planned cutting points CP1, CP2, and CP3 located between the planned welding points WP1, WP2, and WP3 and the primary bonding regions 210, 210', and 210". For example, the planned cutting point CP1 (in FIG. 4, the planned cutting point CP1 is disposed adjacent to the primary bonding region 210) is between the primary bonding region 210 and the light emitting diode 300R bonded thereto and the planned welding point WP1. The planned cutting point CP2 (in FIG. 4, the planned cutting point CP2 is disposed adjacent to the primary bonding region 210') is between the primary bonding region 210' and the light emitting diode 300G bonded thereto and the planned welding point WP2. The planned cutting point CP3 (in FIG. 4, the planned cutting point CP3 is disposed adjacent to the primary bonding region 210") is between the primary bonding region 210" and the light emitting diode 300B bonded thereto and the planned welding point WP3. In addition, the electronic device 10B further includes planned cutting points CP4, CP5, CP6, CP7, CP8, and CP9. The planned cutting points CP4, CP5, and CP6 are located between the primary bonding region 210 and the reserved bonding region 220', and between the planned welding point WP1 and the reserved bonding region 220'. The planned cutting point CP7 is located between the primary bonding region 210' and the reserved bonding region 220, and between the planned welding point WP2 and the reserved bonding region 220. The planned cutting point CP8 is located between the primary bonding region 210" and the reserved bonding region 220, and between the planned welding point WP3 and the reserved bonding region 220. The planned cutting point CP9 is located between the primary bonding region 210 and the reserved bonding region 220, and between the planned welding point WP1 and the reserved bonding region 220.

Taking the light emitting diode 300R and the light emitting diode 300G as examples, under the above disposition, when the light emitting diode 300R and the light emitting diode 300G do not meet the inspection specification (for example, including: dark dots, bright dots, or appearance damage), a repair process of the electronic device 10B may be performed. The above-mentioned repair process includes: the electronic element used for repair (such as a red light emitting diode) is bonded with the bonding pad of the electronic element reserved space 320 in the reserved bonding region 220; next, the electronic element used for repair (such as a green light emitting diode) is bonded with the bonding pad of the electronic element reserved space 320' in the reserved bonding region 220'; next, a laser cutting process is performed on the conductive wire or the bridge circuit on the planned cutting point CP1; next, a laser cutting process is performed on the conductive wire or the bridge circuit on the planned cutting point CP2; next, a laser cutting process is performed on the conductive wire or the bridge circuit on the planned cutting points CP5, CP7, and CP8; then a laser welding process is performed on the planned welding point WP1 and the planned welding point WP2. After the above repair process is completed, a voltage is provided to the electronic device 10B; next, the light emitting diode 300R bonded in the primary bonding region 210 and the light emitting diode 300G bonded in the primary bonding region 210' do not receive the voltage and do not emit light. The electronic elements for repair respectively bonded in the reserved bonding region 220 and the reserved bonding region 220' may receive the above voltage to emit light.

Referring to the disposition in FIG. 5, in some embodiments, when the light emitting diode 300B does not meet the inspection specification (for example, including dark dots, bright dots, or appearance damage), and still does not meet the inspection specification after the first repair is completed, a second repair process may be performed on the electronic device 10B. For example, a first electronic element used for repair (such as a blue light emitting diode) is bonded with the bonding pad of the electronic element reserved space 320 in the reserved bonding region 220; next, a laser cutting process is performed on the conductive wire or the bridge circuit on the planned cutting point CP3; next, a laser welding process is performed on the planned welding point WP3, and then a voltage is provided to the electronic device 10B to test the light-emitting quality of the first electronic element used for repair. If the inspection specification is still not met, a second repair process is performed, in which a second electronic element (such as a blue light emitting diode) used for repair is bonded with the bonding pad of another electronic element reserved space 320' in another reserved bonding region 220'; next, a laser cutting process is performed on the conductive wire or the bridge circuit on the planned cutting points CP7, CP8, and CP9. After the above repair process is completed, a voltage is again provided to the electronic device 10B; next, the light emitting diode 300B bonded in the primary bonding region 210" does not receive the voltage and does not emit light. The electronic element for repair bonded in the reserved bonding region 220' may receive the above voltage to emit light.

In this way, the electronic device 10B may complete the repair of the electronic element through the repair process, so the electronic device 10B may have good electrical quality.

It should be noted herein that in the above repair process, the light emitting diode 300R and the light emitting diode 300G are used as examples for electronic elements that do not comply with the inspection specification. The definition of not complying with the inspection specification may include: the electronic element emits light with a luminance beyond a preset average luminance (that is, too bright), emits light with a luminance less than the preset average luminance (that is, too dark), or does not emit light (that is, not bright). Alternatively, the electronic element may be damaged and thus has a defective appearance. In addition, the size of the electronic element being larger than a preset average size or smaller than the preset average size may also be viewed as not meeting the inspection specification, but this embodiment is not limited to the above examples. In addition, the light emitting diode 300R and the light emitting diode 300B may be electronic elements that do not comply with the inspection specification, too. Alternatively, any one of the light emitting diode 300R, the light emitting diode 300G, or the light emitting diode 300B may be an electronic element that does not meet the inspection specification, and the disclosure is not limited thereto.

Figure 6:
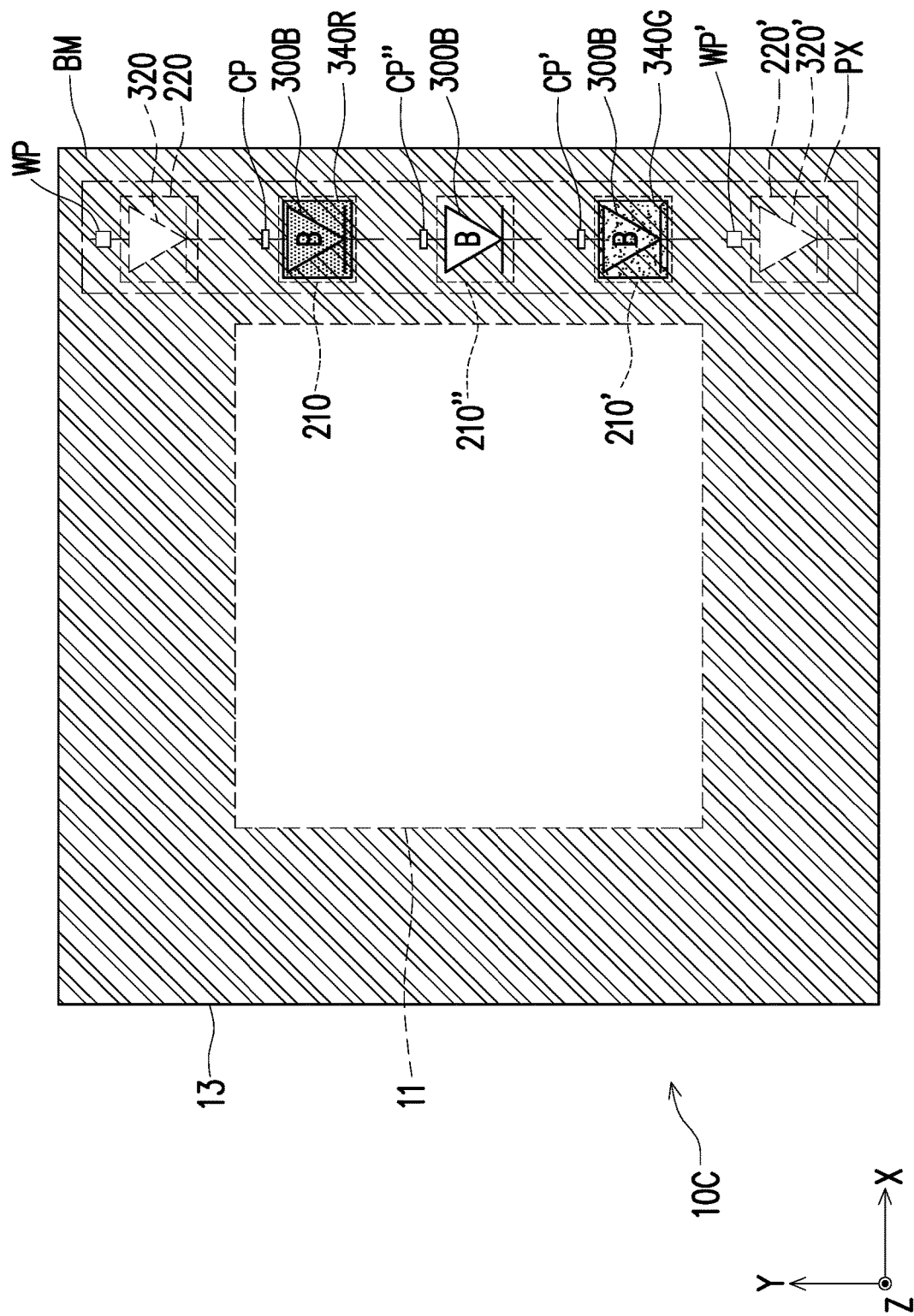
FIG. 6 is a top schematic view of a part of an electronic device according to another embodiment of the disclosure.

FIG. 6 is a top schematic view of a part of an electronic device according to another embodiment of the disclosure. For the clarity of the drawings and the convenience of description, several elements are omitted in FIG. 6. An electronic device 10C of this embodiment is roughly similar to the electronic device 10B of FIG. 4, so the same and similar components in the two embodiments will not be repeated herein. This embodiment is different from the electronic device 10B mainly in that the electronic device 10C includes the unit PX, the opening region 11, and the non-opening region 13 surrounding the opening region 11. The electronic elements respectively bonded with the primary bonding regions 210, 210', and 210" in the unit PX are the blue electronic elements 300B. The electronic device 10C further includes a light conversion layer 340R or a light conversion layer 340G. The light conversion layer 340R overlaps the blue light emitting diode 300B in the primary bonding region 210. The light conversion layer 340G overlaps the blue light emitting diode 300B in the primary bonding region 210'.

For example, the light conversion layer 340R includes a quantum dot (QD) material that emits red light. The light conversion layer 340G includes, for example, a quantum dot material that emits green light. Under the above disposition, the blue light emitted by the blue light emitting diode 300B may be converted into red light by the light conversion layer 340R. Similarly, the blue light emitted by the blue light emitting diode 300B may be converted into green light by the light conversion layer 340G. In this way, the electronic device 10C may meet the requirements of generating light of different colors by disposing the blue light emitting diode 300B alongside quantum dot materials of different colors. In addition, the electronic device 10C may achieve good technical effects similar to the above-mentioned embodiment.

In summary, in the electronic device according to an embodiment of the disclosure, since the circuit layer, the primary bonding region, and the reserved bonding region may overlap the light blocking layer and be disposed in the non-opening region outside the opening region, the unit of the electronic device may pass through the opening region as a unit with a high transmissive display function. In this way, the electronic device may be applied as a transmissive electronic device, or has a good visual effect or display quality. In addition, the primary bonding region is connected to the reserved bonding region to be bonded with electronic elements used for repair or backup through the reserved bonding region. Therefore, the unit of the electronic device has a space reserved for disposing electronic elements, and thus has a design to realize unit repair. In this way, the electronic device has good electrical quality. In addition, since the number of reserved bonding regions may be less than the number of primary bonding regions, the reserved space may be reduced to increase the layout of high-density wiring or increase the transmission rate of the opening region, and electronic elements used for repair may be selectively disposed in the reserved space. In this way, by using the electronic device, costs may be reduced, the space for wiring disposition may be increased, the requirements of a high circuit density design may be met, or the transmission rate of the opening region may be increased. In this way, the electronic device may have good electrical quality.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments.

What is claimed is:

1. An electronic device, comprising:
    a plurality of units, wherein each of the units comprises:
        a plurality of primary bonding regions; and
        at least one reserved bonding region;
    an opening region disposed between two adjacent units of the units, wherein the opening region partially overlaps with the units in a direction along a data wire or a scanning wire;
    a non-opening region surrounding the opening region; and
    a light blocking layer, wherein at least a part of the light blocking layer correspondingly overlaps the non-opening region, at least the part of the light blocking layer surrounds the opening region, and the light blocking layer does not overlap with the opening region,
    wherein each of the at least one reserved bonding region is connected to the primary bonding regions, and the number of the at least one reserved bonding region is less than the number of primary bonding regions.

2. The electronic device according to claim 1, wherein each of the primary bonding regions and each of the at least one reserved bonding region respectively comprise two bonding pads.

3. The electronic device according to claim 1, wherein the electronic device further comprises a plurality of planned welding points located between each of the at least one reserved bonding region and each of the primary bonding regions connecting each of the at least one reserved bonding region.

4. The electronic device according to claim 3, wherein the electronic device further comprises a plurality of planned cutting points located between the planned welding points and each of the primary bonding regions.

5. The electronic device according to claim 1, wherein the primary bonding regions are respectively adapted for being bonded with a blue light emitting diode, a green light emitting diode, or a red light emitting diode.

6. The electronic device according to claim 1, wherein the at least one reserved bonding region is adapted for being bonded with a blue light emitting diode, a green light emitting diode, or a red light emitting diode.

7. The electronic device according to claim 1, wherein the electronic device further comprises at least one light conversion layer, wherein one of the primary bonding regions is adapted for being bonded with a blue light emitting diode, and the at least one light conversion layer overlaps the blue light emitting diode.

8. The electronic device according to claim 1, wherein the primary bonding regions and the at least one reserved bonding region overlap the non-opening region.

9. A method for repairing an electronic device, wherein the method comprises:
    providing the electronic device, comprising:
        a plurality of units, wherein each of the units comprises:
            a plurality of primary bonding regions;
            at least one reserved bonding region; and
            at least one electronic element, wherein the at least one electronic element is correspondingly bonded with one of the primary bonding regions;
        an opening region disposed between two adjacent units of the units, wherein the opening region partially overlaps with the units in a direction along a data wire or a scanning wire;
        a non-opening region surrounding the opening region; and
        a light blocking layer, wherein at least a part of the light blocking layer correspondingly overlaps the non-opening region, at least the part of the light blocking layer surrounds the opening region, and the light blocking layer does not overlap with the opening region,
        wherein each of the at least one reserved bonding region is connected to the primary bonding regions, and the number of the at least one reserved bonding region is less than the number of primary bonding regions,
    performing a repair process on one of the units, comprising:
        bonding an electronic element for repair with the at least one reserved bonding region.

10. The method according to claim 9, wherein each of the primary bonding regions and each of the at least one reserved bonding region respectively comprise two bonding pads.

11. The method according to claim 10, wherein the electronic device further comprises a plurality of planned welding points located between each of the at least one reserved bonding region and each of the primary bonding regions connecting each of the at least one reserved bonding region.

12. The method according to claim 11, wherein the electronic device further comprises a plurality of planned cutting points located between the planned welding points and each of the primary bonding regions.

13. The method according to claim 12, wherein the repair process further comprises:
bonding the electronic element for repair with an electronic element reserved space in the at least one reserved bonding region, and bonding the electronic element for repair with the bonding pad in the at least one reserved bonding region;
performing cutting on a wiring on one of the planned cutting points corresponding to the at least one electronic element; and
performing welding on a wiring on one of the planned welding points corresponding to the at least one electronic element.

14. The method according to claim 13, wherein performing cutting comprises using a laser cutting technology, and performing welding comprises a laser welding technology.

15. The method according to claim 9, wherein the at least one electronic element is a plurality of electronic elements, the electronic elements are respectively located in the primary bonding regions, and the number of electronic elements is greater than or equal to the number of electronic elements for repair.

16. An electronic device, comprising:
a plurality of units, wherein each of the units comprises:
a plurality of primary bonding regions;
at least one reserved bonding region, wherein each of the at least one reserved bonding region is connected to the primary bonding regions, and the number of the at least one reserved bonding region is less than the number of primary bonding regions;
at least one electronic element, wherein the at least one electronic element is correspondingly bonded with one of the primary bonding regions; and
a plurality of planned welding points located between each of the at least one reserved bonding region and each of the primary bonding regions connecting each of the at least one reserved bonding region;
an opening region disposed between two adjacent units of the units, wherein the opening region partially overlaps with the units in a direction along a data wire or a scanning wire;
a non-opening region surrounding the opening region; and
a light blocking layer, wherein at least a part of the light blocking layer correspondingly overlaps the non-opening region, at least the part of the light blocking layer surrounds the opening region, and the light blocking layer does not overlap with the opening region.

17. The electronic device according to claim 16, wherein the electronic device further comprises a plurality of planned cutting points located between the planned welding points and each of the primary bonding regions.

18. The electronic device according to claim 17, wherein the planned cutting points are located between the planned welding points and the at least one reserved bonding region, wherein the number of planned cutting points between a first planned welding point of the planned welding points and the at least one reserved bonding region is greater than the number of planned cutting points between a second planned welding point of the planned welding points and the at least one reserved bonding region.

* * * * *